US007642497B2

(12) United States Patent
Rhodes

(10) Patent No.: US 7,642,497 B2
(45) Date of Patent: *Jan. 5, 2010

(54) CMOS PIXEL AND IMAGING DEVICE SUPPORTING AUTOMATIC LIGHT CONTROL (ALC) AND CORRELATED DOUBLE SAMPLING (CDS)

(75) Inventor: Howard E. Rhodes, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 11/442,136

(22) Filed: May 30, 2006

(65) Prior Publication Data

US 2007/0029469 A1    Feb. 8, 2007

Related U.S. Application Data

(63) Continuation of application No. 10/689,635, filed on Oct. 22, 2003, now Pat. No. 7,105,793.

(60) Provisional application No. 60/483,906, filed on Jul. 2, 2003.

(51) Int. Cl.
  *H01L 27/00* (2006.01)
  *H01L 31/062* (2006.01)
(52) U.S. Cl. .................. 250/208.1; 257/292; 250/214.1
(58) Field of Classification Search .............. 250/208.1, 250/214.1; 257/291, 292; 348/241, 308
  See application file for complete search history.

(56) References Cited

U.S. PATENT DOCUMENTS

| 4,563,708 | A | 1/1986 | Ishibashi |
| 4,701,626 | A | 10/1987 | Ishizaki et al. |
| 6,073,851 | A | 6/2000 | Olmstead et al. |
| 6,140,630 | A | 10/2000 | Rhodes |
| 6,204,524 | B1 | 3/2001 | Rhodes |
| 6,310,366 | B1 | 10/2001 | Rhodes et al. |
| 6,326,652 | B1 | 12/2001 | Rhodes |
| 6,333,205 | B1 | 12/2001 | Rhodes |
| 6,376,868 | B1 | 4/2002 | Rhodes |
| 6,407,440 | B1 * | 6/2002 | Rhodes ........................ 257/462 |

(Continued)

FOREIGN PATENT DOCUMENTS

JP        58-119279        7/1983

(Continued)

OTHER PUBLICATIONS

International Search Report dated Nov. 23, 2004.

*Primary Examiner*—Thanh X Luu
(74) *Attorney, Agent, or Firm*—Dickstein Shapiro LLP

(57) ABSTRACT

Embodiments of the invention provide pixel cells that allow both automatic light control and correlated double sampling operations. The pixel cell includes first and second photo-conversion devices that can be separately read out. For example, the second photo-conversion device can be the pixel cells' floating diffusion region, with an area and doping profile suitable for photo-conversion. An image sensor may include an array of pixel cells, some or all of which have two photo-conversion devices, and peripheral circuitry for reading out signals from the pixel cells. The image sensor's readout circuitry may monitor charge generated by the second photo-conversion devices to determine when to read out signals from the first photo-conversion devices.

8 Claims, 14 Drawing Sheets

U.S. PATENT DOCUMENTS

| | | | |
|---|---|---|---|
| 6,459,077 B1 * | 10/2002 | Hynecek | 250/208.1 |
| 6,777,661 B2 | 8/2004 | Summa et al. | |
| 7,105,793 B2 * | 9/2006 | Rhodes | 250/208.1 |
| 7,115,855 B2 * | 10/2006 | Hong | 250/214.1 |
| 7,238,977 B2 * | 7/2007 | Hong et al. | 257/292 |
| 2002/0018131 A1 | 2/2002 | Kochi | |

FOREIGN PATENT DOCUMENTS

| | | |
|---|---|---|
| JP | 58119279 | 7/1983 |
| JP | 11-266403 | 9/1999 |
| WO | WO-00-78034 | 12/2000 |
| WO | WO 00/78034 A2 | 12/2000 |

* cited by examiner

US 7,642,497 B2

CMOS PIXEL AND IMAGING DEVICE SUPPORTING AUTOMATIC LIGHT CONTROL (ALC) AND CORRELATED DOUBLE SAMPLING (CDS)

CROSS REFERENCE TO OTHER APPLICATION

The present application is a continuation of U.S. patent application Ser. No. 10/689,635, filed on Oct. 22, 2003 now U.S. Pat. No. 7,105,793, which claims the benefit of U.S. provisional patent application Ser. No. 60/483,906, filed Jul. 2, 2003, the disclosures of which are incorporated herein by reference in their entireties.

FIELD OF THE INVENTION

The present invention relates to the field of imaging devices, particularly to improved pixel cells capable of supporting automatic light control and correlated double sampling operations.

BACKGROUND OF THE INVENTION

A typical conventional CMOS imager circuit includes a focal plane array of pixel cells. Each cell includes a photo-conversion device such as, for example, a photogate, photoconductor, or photodiode, for generating and accumulating photo-generated charge in a portion of the substrate of the array. A readout circuit connected to each pixel cell includes at least an output transistor, which receives photo-generated charges from a doped diffusion region and produces an output signal that is read-out through a pixel access transistor.

One typical CMOS imager pixel circuit, the three-transistor (3T) pixel, contains a photo-conversion device for supplying photo-generated charge to a diffusion region; a reset transistor for resetting the diffusion region; a source follower transistor having a gate connected to the diffusion region, for producing an output signal; and a row select transistor for selectively connecting the source follower transistor to a column line of a pixel array. Three-transistor pixel cells have been used to support automatic light control (ALC) operations. ALC is used to control the amount of light integrated by a pixel cell. In a 3T pixel cell, the charge accumulated by a photo-conversion device may be read out prior to resetting the photo-conversion device to a predetermined voltage. Therefore, ALC operations may determine a time for readout based on the amount of charge generated by the photo-conversion device and may adjust the amount of charge further generated by the photo-conversion device in response to the charge present on the photo-conversion device at a particular time.

Another typical CMOS imager pixel employs a four-transistor (4T) configuration, which is similar to the 3T configuration, but utilizes a transfer transistor to gate charge carrier flow from the photo-conversion device to a sensing node, typically a floating diffusion region; in a 4T configuration, the source follower transistor gate is connected to the floating diffusion region.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the foregoing are hereby incorporated by reference herein in their entirety.

A schematic top view of a portion of a semiconductor wafer fragment containing one exemplary CMOS 4T pixel cell 100 is shown in FIG. 1. CMOS pixel cell 100 generally comprises a photo-conversion device 120 for generating charge in response to external light incident on the pixel, and a transfer gate 106 for transferring photoelectric charges from the device 120 to a sensing node, typically a floating diffusion region 110. The floating diffusion region 110 is electrically connected to the gate 108 of an output source follower transistor. The pixel cell 100 also includes a reset transistor having a gate 107 for resetting the floating diffusion region 110 to a predetermined voltage before sensing a signal; and a row select transistor having a gate 109 for outputting a signal from the source follower transistor to an output terminal in response to a row select signal. There are also source/drain regions 115 for the reset, source follower, and row select transistors.

FIG. 2 is a diagrammatic side sectional view of the pixel cell 100 of FIG. 1 taken along line 2-2'. As shown in FIG. 2, the exemplary CMOS pixel cell 100 has a pinned photodiode as the photo-conversion device 120. Pinned photodiode 120 is adjacent to the gate 106 of a transfer transistor and has a p-n-p construction comprising a p-type surface layer 123 and an n-type photodiode region 122 within a p-type substrate 101.

In the CMOS pixel cell 100 depicted in FIGS. 1 and 2, free electrons are generated by incident light and accumulate in the n-type photodiode region 122. This photo-generated charge is transferred to the floating diffusion region 110 when gate 106 receives a signal that turns on the transfer transistor. The source follower transistor produces an output signal from the transferred charge in response to the voltage level received by gate 108.

Typically, as shown in FIG. 2, pinned photodiode 120 is exposed to external light, represented by arrows 187. Other portions of pixel cell 100 are shielded from light, for example, by a metal layer 186. Structures formed above pinned photodiode 120 are typically transparent and may include a color filter 185 and a microlens 180. Conventional pixel cell 100 may also include other layers formed over substrate 101 and photodiode 120, such as insulating and passivation layers (not shown).

The 4T configuration of FIGS. 1 and 2 provides advantages over the 3T configuration. For example, pixel cell 100 is capable of supporting correlated double sampling (CDS) to reduce noise and obtain a more accurate pixel signal. For CDS, the predetermined voltage to which floating diffusion region 110 controls gate 108 to read out a pixel reset signal $V_{rst}$. Then, photo-generated charge from pinned photodiode 120 is transferred to floating diffusion region 110 by operation of transfer gate 106 and a pixel image signal, $V_{pc1}$, is read out via the source follower gate 108. The two values, $V_{rst}$ and $V_{pc1}$, are subtracted thereby reducing noise. Additionally, 4T pixel cell 100 provides lower dark current, which also reduces noise. Accordingly, in a conventional pixel cell 100, because the transfer gate 106 gates the flow of photo-generated charge from the pinned photodiode 120 to the floating diffusion region 110 and, therefore, to readout circuitry, it is not possible to read out photo-generated charge without altering the charge on pinned photodiode 120. Therefore, ALC is not readily used with a conventional 4T pixel cell.

It would be advantageous to have improved techniques for measuring pixel light levels, particularly for 4T pixel cells and other pixel cell having greater than four transistors.

BRIEF SUMMARY OF THE INVENTION

Embodiments of the invention provide pixel cells and methods of forming pixel cells that include two photo-conversion devices. Separate output signals can be read out for the two devices, making it possible to read out signals from one to determine when to read out signals from the other.

Embodiments of the invention also provide an image sensor comprising an array of pixel cells, and pixel cells of the array. At least two pixel cells of the array each comprise a first photo-conversion device for generating charge, a second photo-conversion device for generating charge, and readout circuitry for reading out signals indicating charge generated by the first photo-conversion device and signals indicating charge generated by the photo-conversion second device. There is also circuitry for monitoring the charge generated by the second photo-conversion devices, which may or may not be part of the image sensor. According to embodiments of the invention, the charge generated by the second photo-conversion devices is monitored by sampling the voltages on the second photo-conversion devices. A time for readout of pixel cell of the array is based on the sampled voltages of the second photo-conversion devices.

A second photo-conversion device within a pixel cell, allows both automatic light control (ALC) and correlated double sampling (CDS) operations. Additionally an image sensor employing a number of pixel cells according to embodiments of the invention may perform ALC and CDS operations.

BRIEF DESCRIPTION OF THE DRAWINGS

The foregoing and other aspects of the invention will be better understood from the following detailed description of the invention, which is provided in connection with the accompanying drawings, in which.

DETAILED DESCRIPTION OF THE INVENTION

Figure 1:
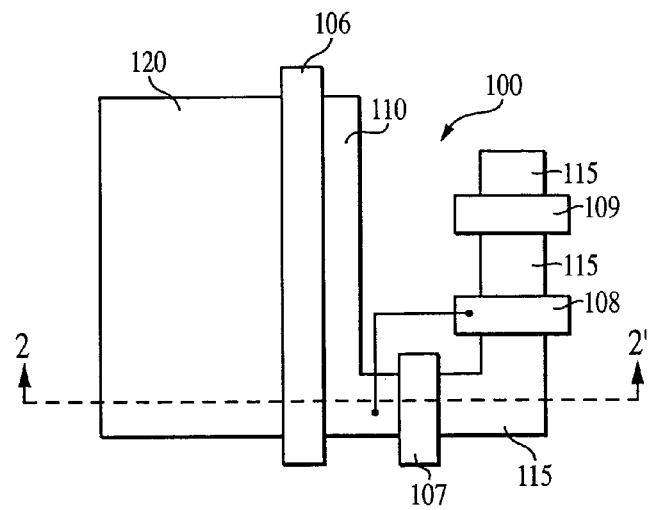
FIG. 1 is a top plan view of an exemplary conventional CMOS pixel cell.

In the following detailed description, reference is made to the accompanying drawings, which form a part hereof and illustrate specific embodiments in which the invention may be practiced. In the drawings, like reference numerals describe substantially similar components throughout the several views. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI), or silicon-on-sapphire (SOS) technology, doped and undoped semiconductors, epitaxial layers of silicon supported by a base semiconductor foundation, and other semiconductor structures, as well as insulating substrates such as glass or quartz. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium-arsenide.

The term "pixel" refers to a picture element unit cell containing a photo-conversion device and associated transistors or other circuitry that convert electromagnetic radiation to an electrical signal. For purposes of illustration, a representative pixel is illustrated in the figures and description herein, and typically fabrication of all pixels in an image sensor will proceed concurrently in a similar fashion.

The invention provides embodiments in which a pixel cell includes at least two photo-conversion devices that can be separately read out. Pixel cells of the embodiments are especially useful for implementing automatic light control (ALC) in a pixel cell with more than three transistors, such as a four transistor (4T) pixel cell, which includes a transfer gate between a first photo-conversion device and a floating diffusion region. Because the first photo-conversion device is not directly connected to the gate of the source follower transistor, it is not possible to read out photo-generated charge on the first device without altering charge stored by the first photo-conversion device, such as pinned photodiode 120 in FIGS. 1 and 2. Although 4T, and other similarly configured pixel cells, make it possible to perform correlated double sampling (CDS), they also may interfere with ALC.

Figure 3:
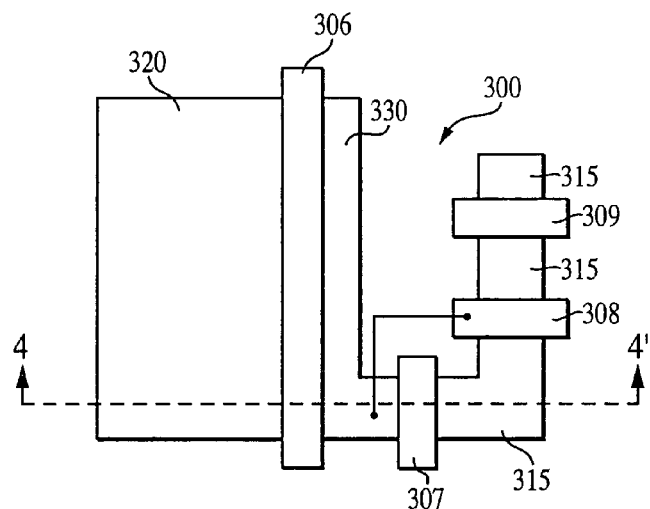
FIG. 3 is a top plan view of a pixel cell according to an exemplary embodiment of the invention.
Figure 4A:
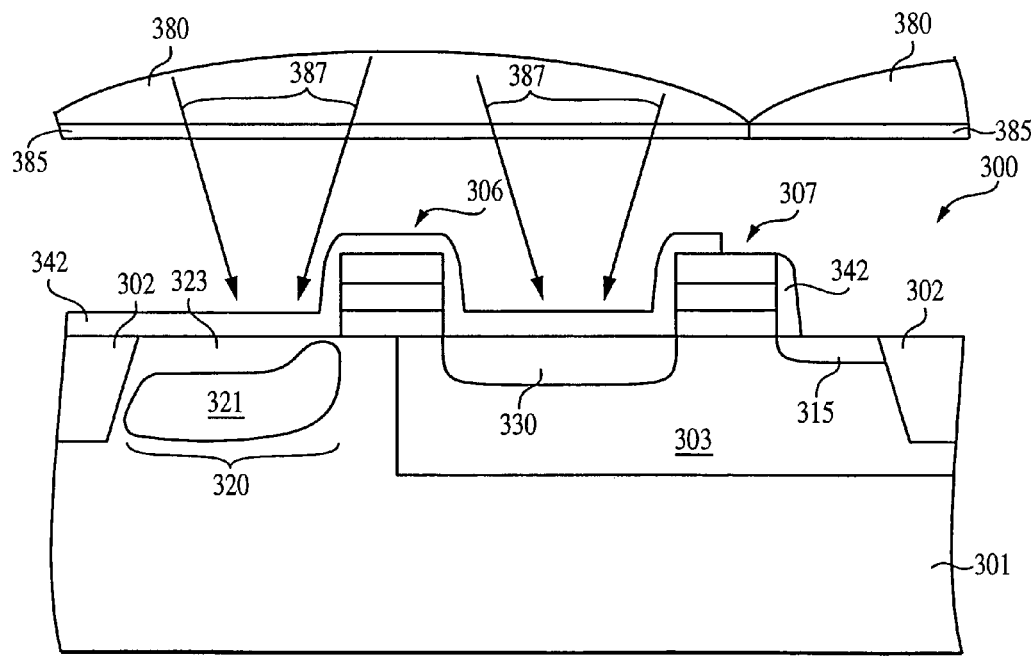
FIG. 4A is a diagrammatic side sectional view of the pixel cell of FIG. 3 according to an exemplary embodiments of the invention.
Figure 4B:
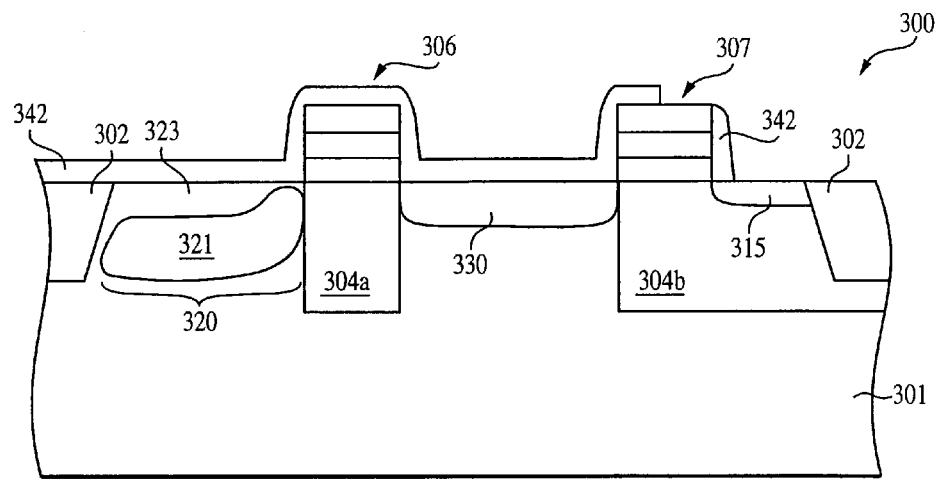
FIG. 4B is a diagrammatic side sectional view of the pixel cell of FIG. 3 according to an exemplary embodiments of the invention.
Figure 4C:
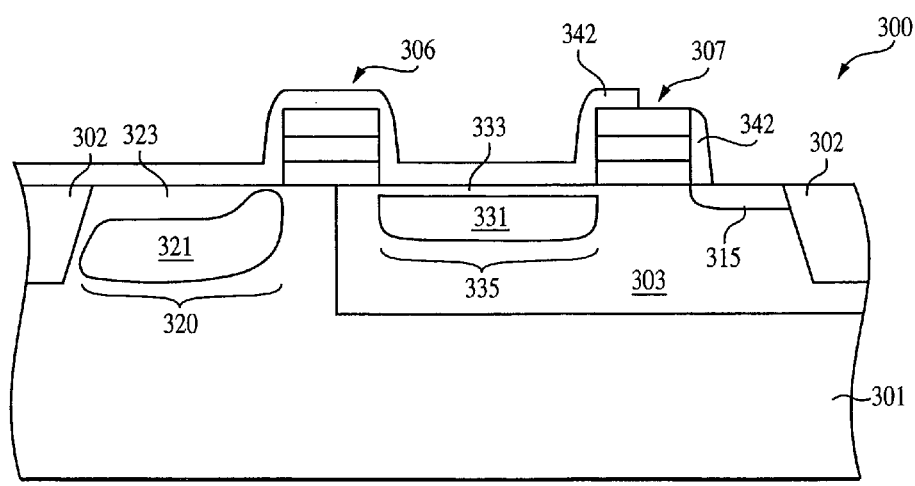
FIG. 4C is a diagrammatic side sectional view of the pixel cell of FIG. 3 according to an exemplary embodiments of the invention.
Figure 5:
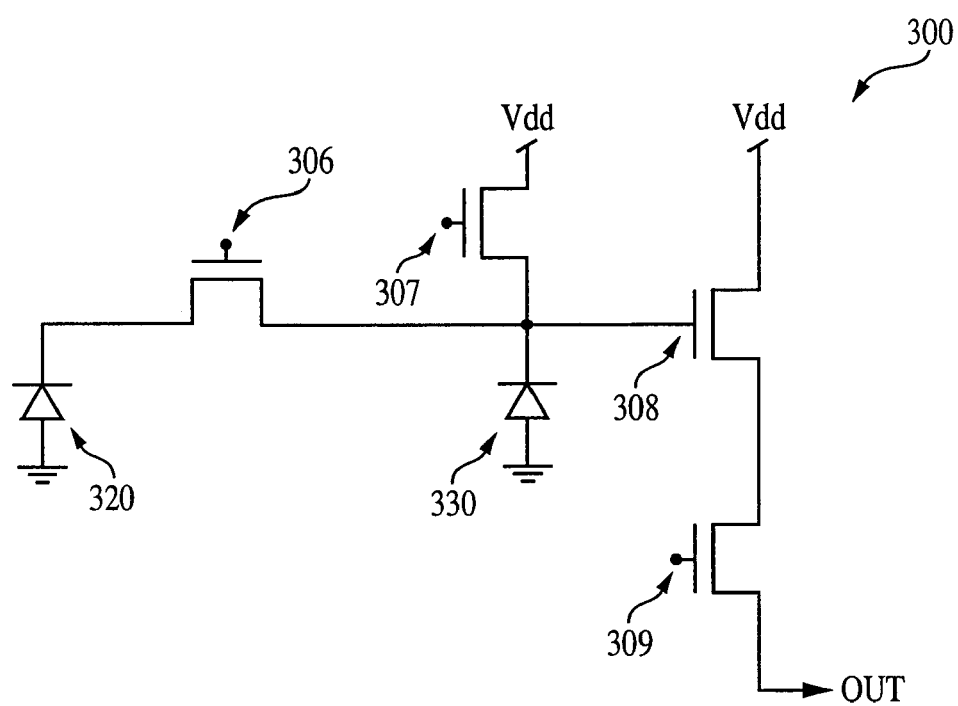
FIG. 5 is a schematic diagram of the pixel cell of FIG. 3.

Referring now to the drawings, FIG. 3 is a top plan view of a CMOS pixel cell 300 according to an exemplary embodiment of the invention. FIGS. 4A-4C depict cross-sectional views of pixel cell 300 along line 4-4' according to exemplary embodiments of the invention. FIG. 5 is a schematic diagram of pixel cell 300.

Pixel cell 300 includes a first photo-conversion device, shown as a pinned photodiode 320, for generating charge in response to external light incident on pixel cell 300. Adjacent to pinned photodiode 320 is a gate 306 of a first transistor. The first transistor is illustratively a transfer transistor for transferring photo-generated charge to a sensing node at a time for readout of the photo-generated charge.

The sensing node is configured to include a second photo-conversion device, and is illustratively a floating diffusion region 330. Floating diffusion region 330 has an area, $A_{330}$, which is enlarged as compared to a floating diffusion region of a conventional pixel cell. Area $A_{330}$ is sufficiently large to allow floating diffusion region 330 to function as a second photo-conversion device. As floating diffusion region 330 generates charge, the voltage level of floating diffusion region 330 can be monitored. By providing a second photo-conversion device, pixel cell 300 may support automatic light control (ALC) operations as well as correlated double sampling (CDS), as described in more detail herein.

Pixel cell 300 also includes gates 307, 308, and 309 of reset, source follower and row select transistors, respectively, and source/drain regions 315 of those transistors.

As shown in FIGS. 4A-4C, there is a substrate 301, which may be a p-type substrate. There are isolation regions in the substrate 301, which are shown as shallow trench isolation (STI) regions 302. Adjacent to an STI region 302 is pinned photodiode 320. Pinned photodiode 320 includes a charge accumulation region 321 below the surface of the substrate 301, which is illustratively an n-type region. Over charge accumulation region 321 is a p+ surface layer 323. Adjacent to pinned photodiode 320 is transfer gate 306.

In the exemplary embodiments depicted in FIGS. 4A and 4B, floating diffusion region 330 may be an n-type region below the surface of substrate 301. Alternatively, as depicted in FIG. 4C, floating diffusion region 330 may be a second pinned photodiode 335 and include an n-type region 331 below the surface of the substrate and underlying a p+ surface layer 333. In such a case, second pinned photodiode 335 may have a higher pinning voltage, $V_{pin2}$, than a pinning voltage, $V_{pin1}$, for pinned photodiode 320. For simplicity, a second photo-conversion device of pixel cell 300 is primarily referred to herein as a floating diffusion region 330. It should be understood that a reference to floating diffusion region 330 is also a reference to a second photo-conversion device, and more specifically to second pinned photodiode 335, except where differences between such devices are explicitly addressed herein.

Figure 2:
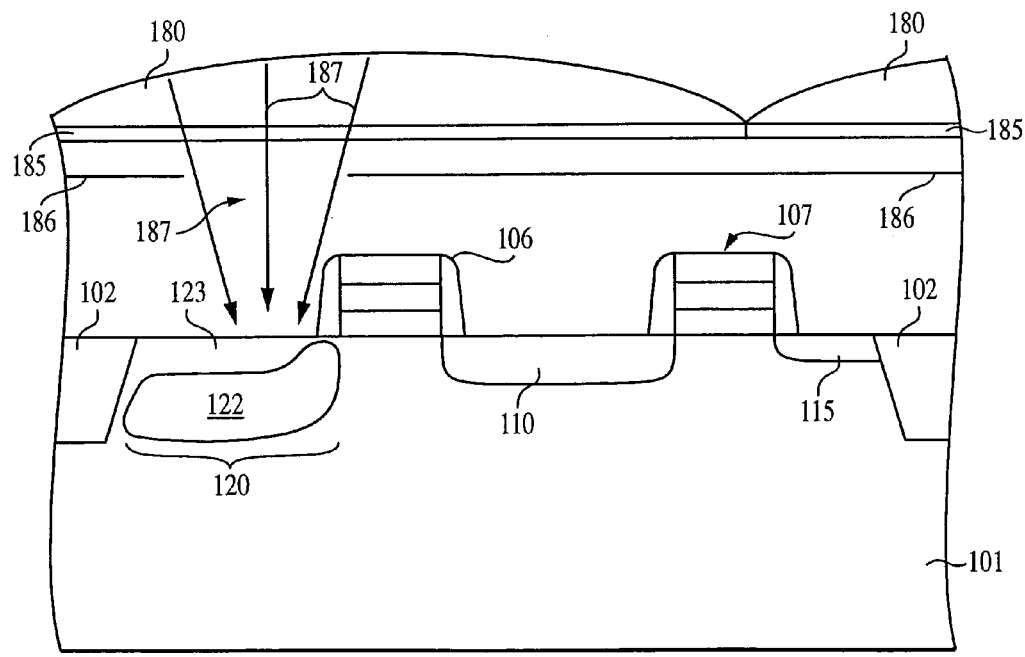
FIG. 2 is a diagrammatic side sectional view of the FIG. 1 pixel cell taken along line 2-2'.

As noted above, floating diffusion region 330 functions as a second photo-conversion device. Therefore, it is not completely shielded from light, for example, by a metal layer, as in conventional pixel cell 100 (FIGS. 1 and 2). Although no metal layer is shown in FIG. 4A, it should be noted that a metal layer may shield other portions of the pixel cell 300. As shown in FIG. 4A, light, represented by arrows 387, may reach floating diffusion region 330 through components of pixel cell 300 formed over substrate 301, such as, for example, a microlens 380 and a color filter 385. There may also be additional layers (not shown) of pixel cell 300 over substrate 301, including, but not limited to insulating and passivation layers, which allow light to reach floating diffusion region 330. For simplicity, light access is only shown in FIG. 4A, however, light is similarly able to reach floating diffusion region 330, or second pinned photodiode 335, in the embodiments of FIGS. 4B and 4C, respectively.

Floating diffusion region 330 is adjacent to the gate 307 of a reset transistor, which has a source/drain region 315 on a side of the reset gate 307 opposite to floating diffusion region 330. There is also a dielectric layer 342, which is illustratively over pinned photodiode 320, transfer gate 306 and floating diffusion region 330; partially over reset gate 307 on a side adjacent to floating diffusion region 330; and in a spacer on a sidewall of reset gate 307.

There may also be one or more wells of a first conductivity type, which is illustratively p-type, formed in the substrate 301. FIGS. 4A and 4C show p-well 303 extending from a surface of substrate 301 to a depth below the surface, and extending under reset gate 307, an STI region 302 adjacent to the reset source/drain region 315, and a portion of transfer gate 306. Floating diffusion region 330 (or second pinned photodiode 335 (FIG. 4C)) and reset source/drain region 315 are in p-well 303.

Alternatively, pixel cell 300 may include two or more p-well regions, such as regions 304a, 304b, as shown in FIG. 4B. In the embodiment of FIG. 4B, there is a p-well 304a below the transfer gate 306, extending from a surface of substrate 301 to a depth below the surface. There is also a p-well 304b extending from a surface of substrate 301 to a depth below the surface, and extending under an STI region 302 adjacent to the reset source/drain region 315, and a portion of the reset gate 307. The reset source/drain region 315 is formed in p-well 304b. Floating diffusion region 330, however, is not formed within a p-well, and, thus, may have an improved response to red light. P-wells 304a, 304b may also be used in place of p-well 303 in the embodiment of FIG. 4C, such that second photodiode 335 is not formed in a p-well.

Although the above exemplary embodiments are described in connection with a four-transistor (4T) pixel cell, the invention may also be embodied in other pixel cell designs, including those designs having different numbers of transistors. Without being limiting, such a design may include a five-transistor (5T) pixel cell or a six-transistor (6T) pixel cell. Five and six-transistor pixel cells differ from a 4T pixel cell by the addition of one or more transistors, such as a shutter transistor and/or an anti-blooming transistor. Additionally, the invention is not limited to pixel cells having a gate of a source follower transistor connected to a second photo-conversion device. Accordingly, alternative readout circuitry may be employed within a pixel cell.

An exemplary embodiment for the fabrication of pixel cell 300 is described below with reference to FIGS. 6A through 6H. No particular order is required for any of the actions described herein, except for those logically requiring the results of prior actions. Accordingly, while the actions below are described as being performed in a general order, the order is exemplary only and may be altered.

Figure 6A:
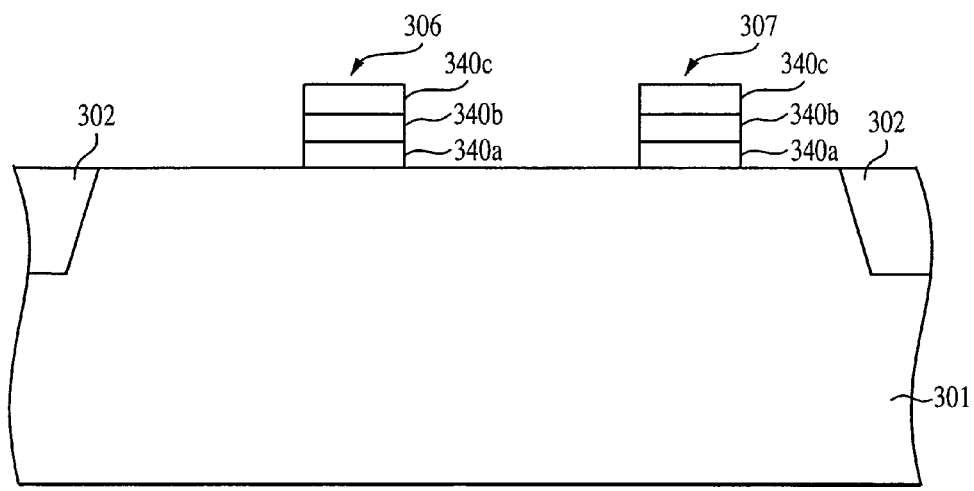
FIG. 6A is a cross-sectional view of the pixel cell of FIG. 3 at an initial stage of fabrication.

FIG. 6A illustrates a pixel cell 300 at an initial stage of fabrication. Substrate 301 is illustratively of a first conductivity type, which is illustratively p-type. Isolation regions 302 are formed in the substrate 301 and filled with a dielectric material. The dielectric material may be an oxide material, for example a silicon oxide, such as SiO or $SiO_2$; oxynitride; a nitride material, such as silicon nitride; silicon carbide; a high temperature polymer; or other suitable dielectric material. As shown in FIG. 6A, the isolation region 302 can be a shallow trench isolation (STI) region and the dielectric material is preferably a high density plasma (HDP) oxide, a material which has a high ability to effectively fill narrow trenches.

As shown in FIG. 6A, a first insulating layer 340a of, for example, silicon oxide is grown or deposited on the substrate 301. First insulating layer 340a serves as the gate oxide layer for the subsequently formed transistor gates 306 and 307. Next, a layer of conductive material 340b is deposited over the oxide layer 340a. The conductive layer 340b serves as the gate electrode for the subsequently formed transistors. Conductive layer 340b may be a layer of polysilicon, which may be doped to a second conductivity type, e.g. n-type. A second insulating layer 340c is deposited over the polysilicon layer 340b. Second insulating layer 340c may be formed of, for example, an oxide ($SiO_2$), a nitride (silicon nitride), an oxynitride (silicon oxynitride), ON (oxide-nitride), NO (nitride-oxide), or ONO (oxide-nitride-oxide).

The layers, 340a, 340b, and 340c, may be formed by conventional deposition methods, such as chemical vapor deposition (CVD) or plasma chemical vapor deposition (PECVD), among others. The layers 340a, 340b, and 340c are then patterned and etched to form the multilayer gate stack structures 306 and 307 shown in FIG. 6A. The gate stack 306 is the gate structure for a transfer transistor and gate stack 307 is the gate structure for a reset transistor.

The invention is not limited to the structure of the gates 306 and 307 described above. Additional layers may be added or the gates 306 and 307 may be altered as is desired and known in the art. For example, a silicide layer (not shown) may be formed between the gate electrodes 340b and the second insulating layers 340c. The silicide layer may be included in the gates 306 and 307, or in all of the transistor gate structures in an image sensor circuit, and may be titanium silicide, tungsten silicide, cobalt silicide, molybdenum silicide, or tantalum silicide. This additional conductive layer may also be a barrier layer/refractory metal such as TiN/W or W/$N_x$/W, or it could be formed entirely of $WN_x$.

Figure 6B:
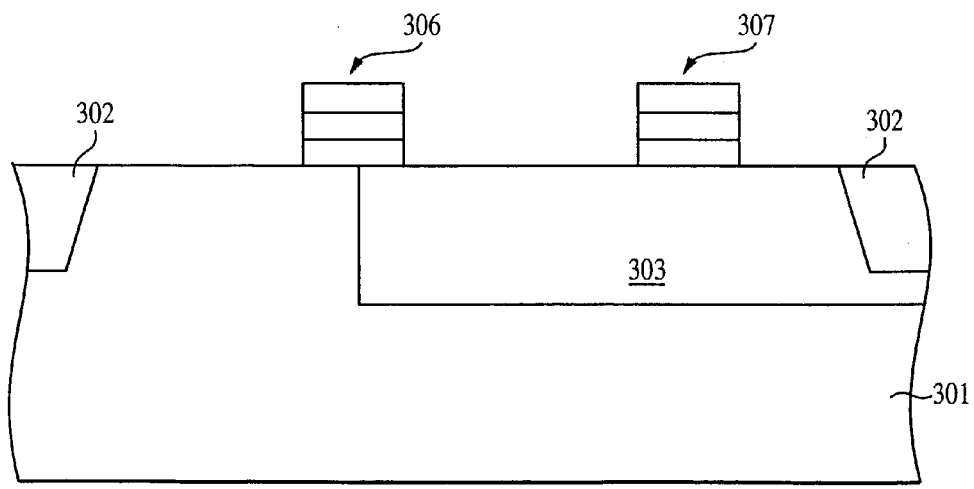
FIG. 6B-6H are cross-sectional views of the pixel cell of FIG. 3 at intermediate stages of fabrication.
Figure 6C:
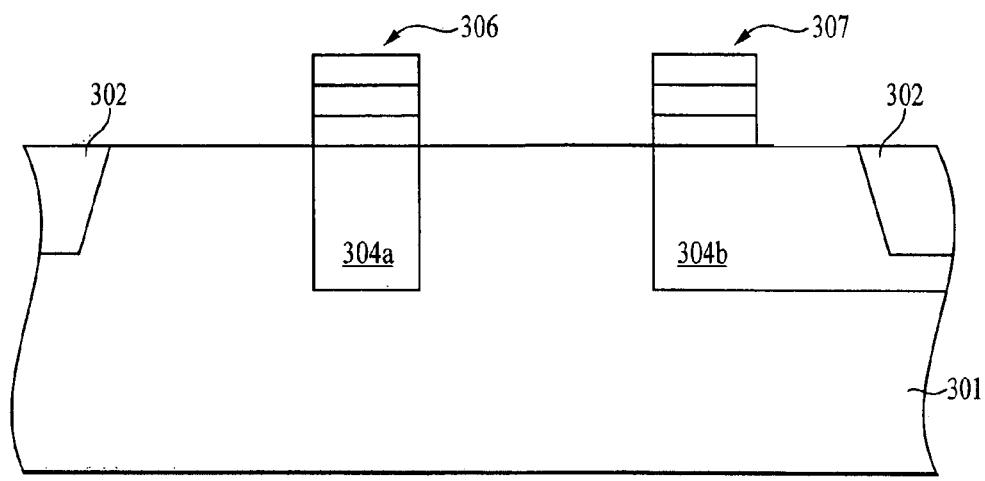

A well of a first conductivity type, illustratively a p-well 303, is implanted into substrate 301 as shown in FIG. 6B. P-well 303 is formed in the substrate 301 from a point below the transfer gate 306 to a point below the STI region 302 that is on a side of the reset gate 307 opposite to the transfer gate 306. Alternatively, as shown in FIG. 6C, two p-wells 304a and 304b may be formed in the substrate 301: a first p-well 304a may be formed below the transfer gate 306 and a second p-well 304b may be formed below the reset gate 307 and extending below the STI region 302 that is on a side of the reset gate 307 opposite to the transfer gate 306. P-wells 303, 304a, 304b may be formed by known methods. For example, a layer of photoresist (not shown) may be patterned over the substrate 301 having an opening over the area where a p-well 303, 304a, 304b is to be formed. A p-type dopant, such as boron, may be implanted into the substrate through the opening in the photoresist. Illustratively, the p-wells 303, 304a, 304b are formed having a p-type dopant concentration that is higher than adjacent portions of the substrate 301.

Figure 6D:
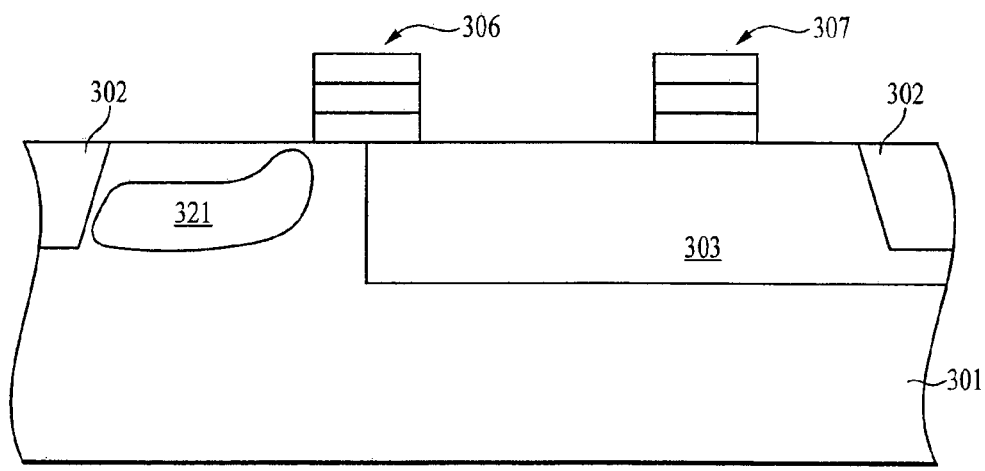

A doped region 321 of a second conductivity type is implanted in the substrate 301 for the pinned photodiode 320, as shown in FIG. 6D. Doped region 321 is illustratively lightly doped n-type region. Doped region 321 may be formed by methods known in the art. For example, a layer of photoresist (not shown) may be patterned over the substrate 301 having an opening over the surface of the substrate 301 where pinned photodiode 320 is to be formed. An n-type dopant, such as phosphorus, arsenic, or antimony, may be implanted through the opening and into the substrate 301. Multiple implants may be used to tailor the profile of region 321. If desired, an angled implantation may be conducted to form the doped region 321, such that implantation is carried out at angles other than 90 degrees relative to the surface of the substrate 301.

Pinned photodiode region 321 is on an opposite side of the transfer gate 306 from the reset gate 307 and is approximately aligned with an edge of the transfer gate 306 forming a photosensitive charge accumulating region for collecting photogenerated charge.

Figure 6E:
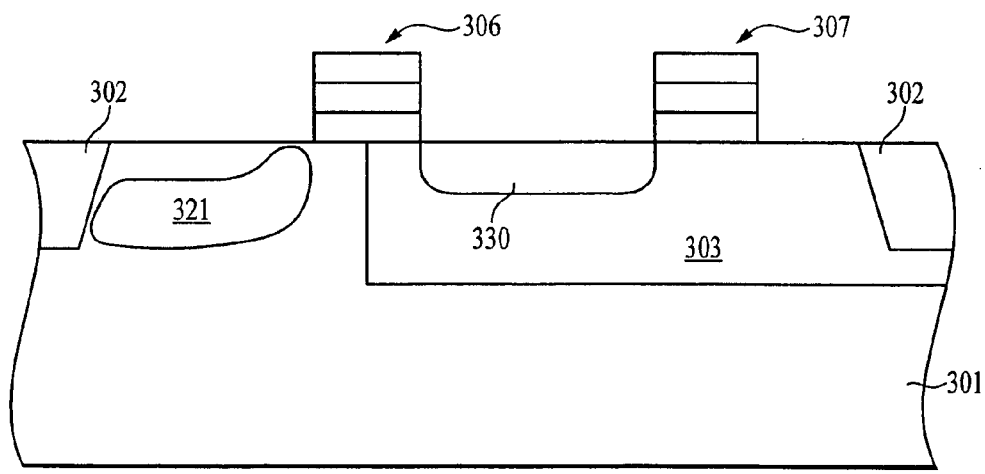

Referring to FIG. 6E, a floating diffusion region 330 is formed between transfer gate 306 and reset gate 307. Floating diffusion region 330 may be formed by known methods as a doped region of a second conductivity type, which is illustratively n-type, in the substrate 301. As noted above, floating diffusion region is formed having a surface area, such that floating diffusion region 330 serves as a second photo-conversion device for generating and accumulating charge in response to external incident light.

Alternatively, as noted above, floating diffusion region 330 may instead be a second pinned photodiode 335, which may be formed as described in connection with FIGS. 6D and 6G. In such a case, second pinned photodiode 335 may be formed at a same time and in a same manner as pinned photodiode 320.

Figure 6F:
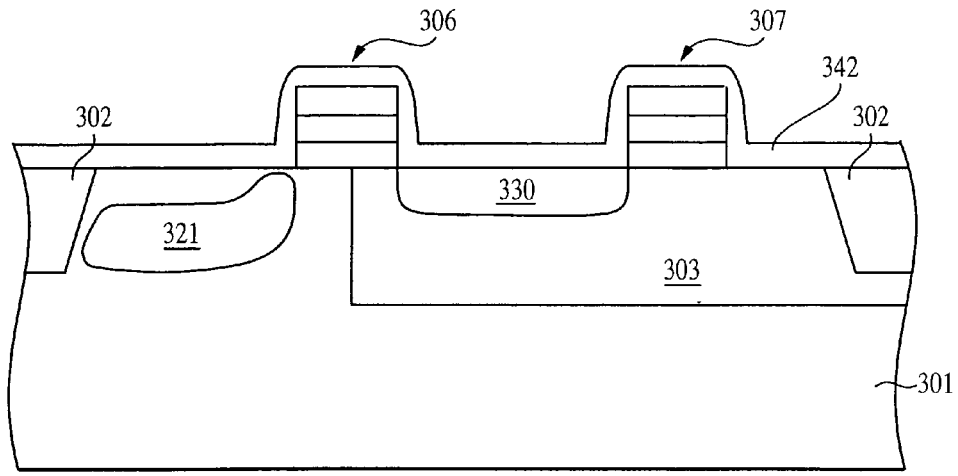

FIG. 6F depicts the formation of an oxide layer 342. Illustratively, layer 342 is an oxide layer, but layer 342 may instead be any appropriate dielectric material, such as silicon dioxide, silicon nitride, an oxynitride, ON, NO, ONO, or TEOS, among others, formed by methods known in the art.

Figure 6G:
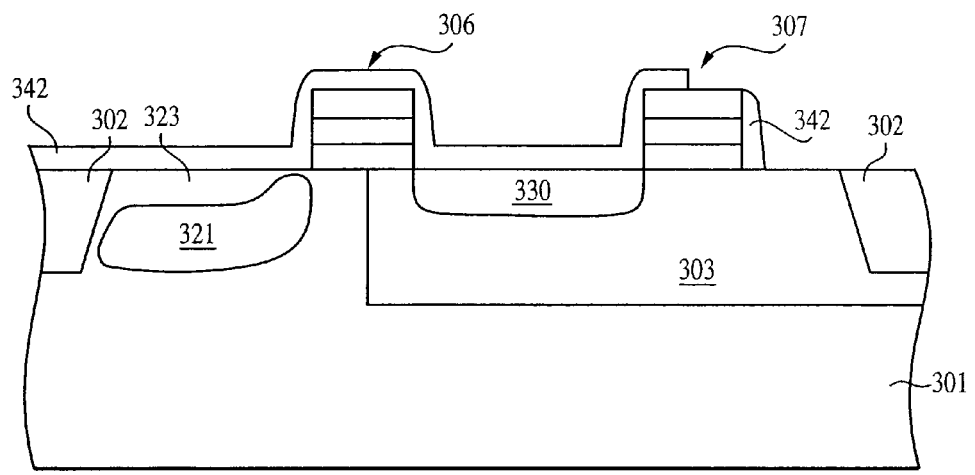

Doped surface layer 323 for the pinned photodiode 320 is implanted, as illustrated in FIG. 6G. Doped surface layer 323 is doped to a first conductivity type, which for exemplary purposes is p-type. Illustratively, doped surface layer 323 is a highly doped p+ surface layer. A p-type dopant, such as boron, indium, or any other suitable p-type dopant, may be used to form p+ surface layer 323.

P+ surface layer 323 may be formed by known techniques. For example, layer 323 may be formed by implanting p-type ions through openings in a layer of photoresist. Alternatively, layer 323 may be formed by a gas source plasma doping process, or by diffusing a p-type dopant into the substrate 301 from an in-situ doped layer or a doped oxide layer deposited over the area where layer 323 is to be formed.

As shown in FIG. 6G, a dry etch step is conducted to etch portions of the oxide layer 342. Oxide layer 342 may be etched such that remaining portions form a sidewall spacer on a sidewall of reset gate 307 opposite to floating diffusion region 330 and a protective layer 342 over the transfer gate 306, the photodiode 320, the floating diffusion region 330 and a portion of the reset gate 307 adjacent to the floating diffusion region 330. Alternatively, oxide layer 342 may be etched such that only sidewall spacers on gates 306 and 307 remain.

Figure 6H:
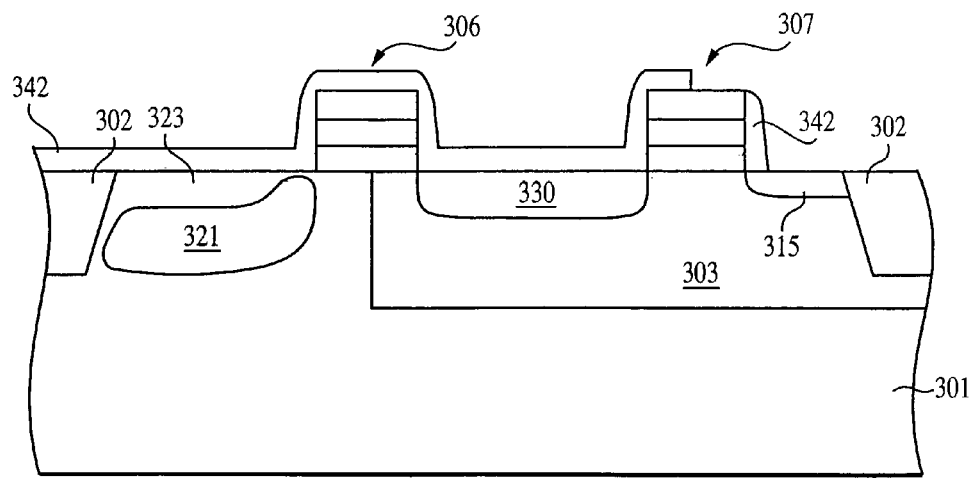

Reset source/drain region 315 may be implanted by known methods to achieve the structure shown in FIG. 6H. Source/drain region 315 is formed as a region of a second conductivity type, which for exemplary purposes is n-type. Any suitable n-type dopant, such as phosphorus, arsenic, or antimony, may be used to form source/drain region 315.

Conventional processing methods may be used to complete the pixel cell 300. For example, insulating, shielding, and metallization layers to connect gate lines and other connections to the pixel cell 300 may be formed. As noted above, floating diffusion region 330 serves as a second photo-conversion device and, therefore, is not completely shielded from light by structures of pixel cell 300. Also, the entire surface may be covered with a passivation layer (not shown) of, for example, silicon dioxide, BSG, PSG, or BPSG, which is CMP planarized and etched to provide contact holes, which are then metallized to provide contacts. Conventional layers of conductors and insulators may also be used to interconnect the structures and to connect pixel cell 300 to peripheral circuitry, and filters 385 and microlenses 380 (FIG. 4A) may also be formed.

While the above embodiments are described in connection with the formation of pnp-type photodiodes the invention is not limited to these embodiments. The invention also has applicability to other types of photo-conversion devices, such as a photodiode formed from np or npn regions in a substrate, a photogate, or a photoconductor. If an npn-type photodiode is formed the dopant and conductivity types of all structures would change accordingly, with the transfer and shutter gates being part of PMOS transistors, rather than NMOS transistors as in the embodiments described above.

Figure 7:
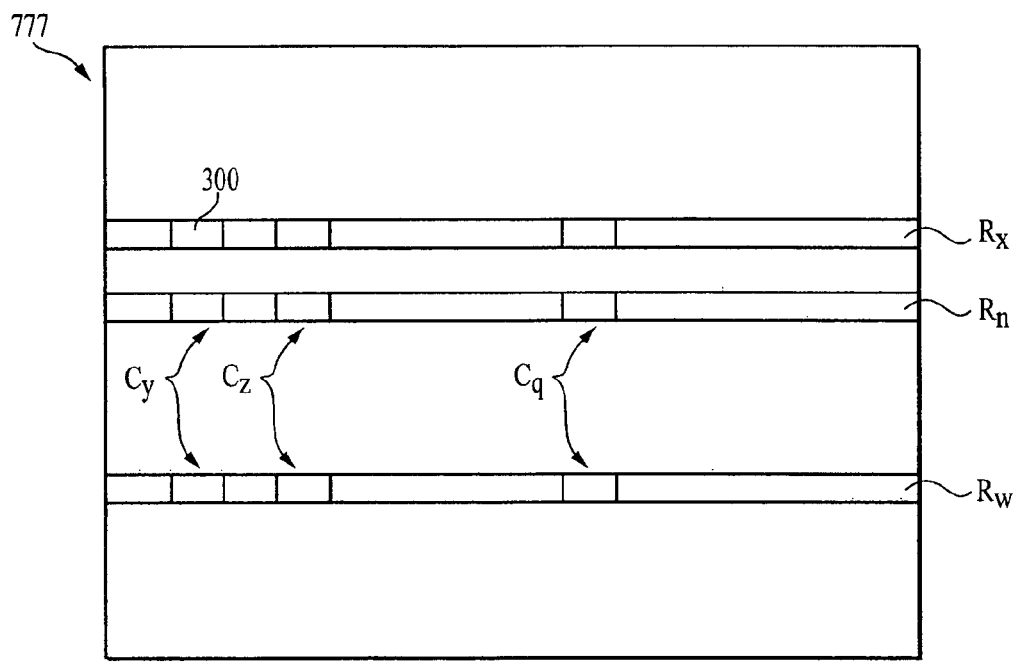
FIG. 7 is a block diagram of an array of pixel cells according to an embodiment of the invention.

As shown in FIG. 7, pixel cell 300 may be part of an array 777 of pixel cells. Pixel cells of array 777 are illustratively arranged in columns and rows. In the example of FIG. 7, pixel cell 300 is shown as part of row x and column y. Array 777 may have any number of columns and rows. For simplicity, only rows $R_x$, $R_n$, and $R_w$; and columns $C_y$, $C_z$, and $C_q$ are explicitly depicted. Values for x, w, n, y, z, and q may be chosen as desired and may depend on the total number of columns and rows for a particular array.

All pixel cells in rows $R_x$, $R_n$, and $R_w$ may be formed as described above in connection with FIGS. 6A-6H. Although three non-adjacent rows of pixel cells 300 are shown in FIG. 7, the invention is not limited to a specific number of rows of pixel cells 300, or a specific configuration of such rows. Accordingly, rows of pixel cells 300 may be adjacent to one another; and any number of rows of array 777 may include, or all pixel cells of array may be pixel cells 300.

Figure 8:
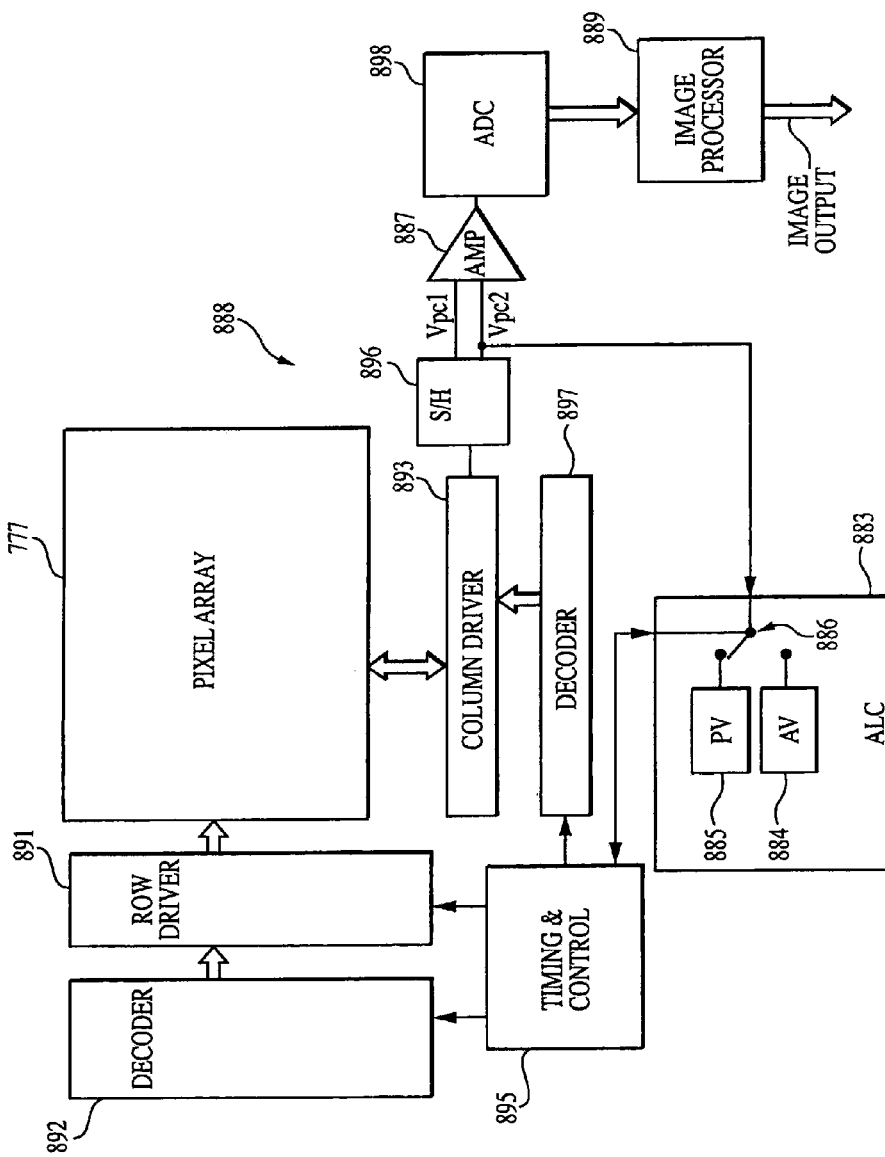
FIG. 8 is a block diagram of an image sensor according to an embodiment of the invention.

FIG. 8 is a block diagram of an exemplary CMOS image sensor 888 according to an embodiment of the invention. The image sensor includes pixel array 777 described above in connection with FIG. 7.

The image sensor 888 also includes row select lines, and column select lines for selecting rows and columns of array 777 for readout or monitoring. The row lines are selectively activated by a row driver 891 in response to row address decoder 892. The column select lines are selectively activated by a column driver 893 in response to column address decoder 897.

The pixel array 777 is operated by the timing and control circuit 895, which controls address decoders 892, 897 for selecting the appropriate row and column lines for pixel signal readout or monitoring. The pixel signals are read by a sample and hold circuit (S/H) 896 associated with the column driver 893, which includes one S/H cell for storing a pixel image signal ($V_{pc1}$) and another S/H cell for storing a pixel signal corresponding to charge generated by photo-conversion in the floating diffusion region ($V_{pc2}$). In a pixel cell 300 operated as described below, $V_{pc1}$ is representative of the charge accumulated on photodiode 320.

Image sensor 888 also includes ALC circuitry 883 for performing ALC operations. ALC circuitry 883 monitors $V_{pc2}$ from pixel cells under control of timing and control circuitry 895. For purposes of this specification, the term "monitor" means obtaining signals $V_{pc2}$ until a criterion is met. When ALC circuitry 883 determines that the criterion has been met, circuitry 883 causes a readout process to commence.

ALC circuitry 883 may include a peak value (PV) monitoring circuit 885 and an average value (AV) monitoring circuit 884 selected by switch 886 in response to timing and control circuitry 895. Where a time for readout process, including readout of $V_{pc1}$, is to be determined based on a monitored pixel cell having accumulated the greatest amount of charge in its floating diffusion region 330, peak value monitoring circuit 885 is used. Circuit 885 may be configured as is known in the art. When $V_{pc2}$ for any one of the monitored pixel cells is approximately equal to a reference trigger voltage, $V_{trigger}$, ALC circuitry 883 causes timing and control circuitry 895 to begin a readout process, including readout of $V_{pc1}$, of all pixel cells of array 777.

Where a time for a readout process is to be based on the average accumulated charge over all monitored pixel cells, average value monitoring circuit 884 is used. Circuit 884 may be configured as is known in the art. In such a case, ALC circuitry 883 monitors signals, $V_{pc2}$, from predetermined pixel cells and determines an average value $V_{avg}$ of the monitored signals. When $V_{avg}$ is approximately equal to $V_{trigger}$, ALC circuitry 883 causes timing and control circuitry 895 to begin the readout process of all pixel cells of array 777.

Although ALC circuitry 883 is depicted as part of image sensor 888, ALC circuitry 883 may also be separate from image sensor 888. Without being limiting, for example, ALC circuitry may be included in the form of hardware or equivalent software in a processor, such as a CPU, which communicates with image sensor 888.

A value for $V_{trigger}$ may be selected as desired. For example, $V_{trigger}$ may be chosen such that readout will occur only when pixel cells of array 777 have accumulated sufficient charge to result in an image in which characteristics of the imaged subject matter are visible. Otherwise stated, $V_{trigger}$ may be chosen such that a resultant image will not be too dark.

Figure 9A:
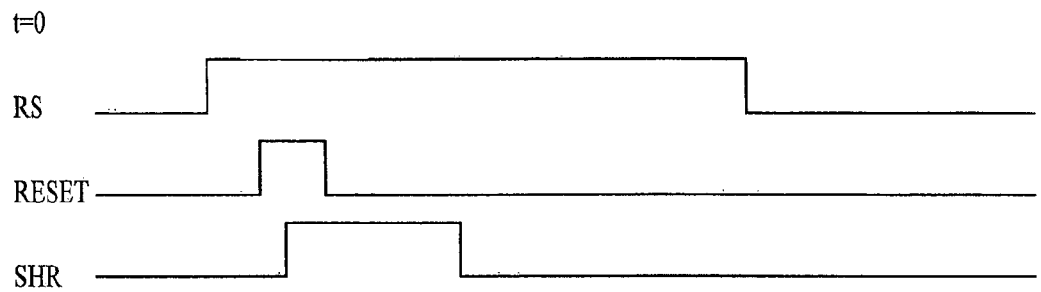
FIG. 9A is an exemplary timing diagram for a monitoring operation of an image sensor at a time t=0 according to an embodiment of the invention.
Figure 9B:
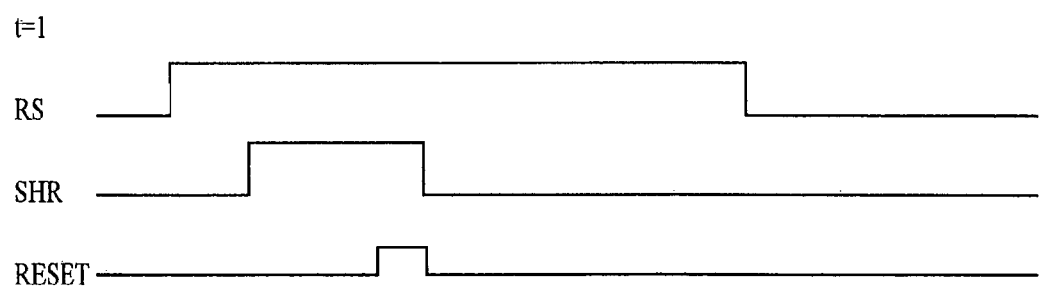
FIG. 9B is an exemplary timing diagram for a monitoring operation of an image sensor at a time t=1 according to an embodiment of the invention.
Figure 9C:
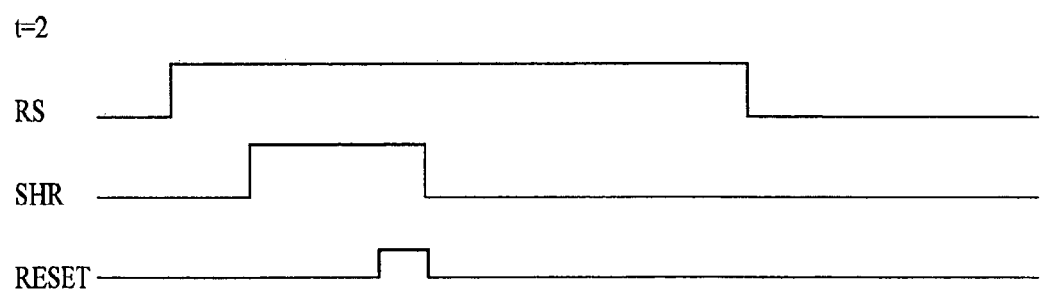
FIG. 9C is an exemplary timing diagram for a monitoring operation of an image sensor at a time t=2 according to an embodiment of the invention.

FIGS. 9A-9C are timing diagrams for the monitoring operations of image sensor 888 according to an exemplary embodiment of the invention. According to an exemplary embodiment of the invention, charge accumulated by floating diffusion regions 330 of pixel cells 300 in rows $R_x$, $R_n$, and $R_w$ is monitored. For simplicity, monitoring operations are described with reference to a single pixel cell 300, however, all monitored pixel cells 300 of array 777 may operate as described below in connection with FIGS. 9A-9C.

Figure 10A:
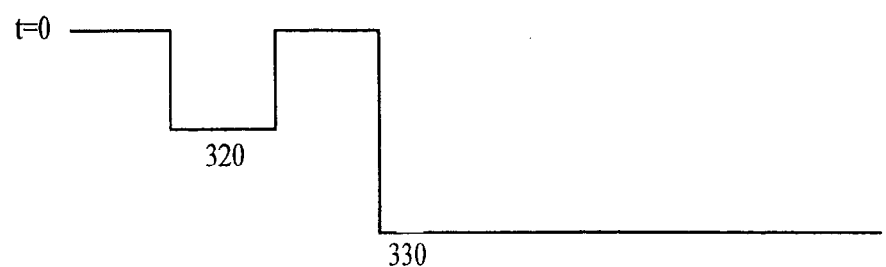
FIG. 10A is a potential well diagram of a pixel cell corresponding to a monitoring operation of FIG. 9A.

Prior to commencement of the monitoring process, the subject matter to be imaged is illuminated by light. As shown in FIG. 9A, at a time t=0, the floating diffusion region 330 is reset to a predetermined voltage, illustratively $V_{dd}$. For this, timing and control circuitry 895 pulses a row select signal (RS) high to turn on the row select gate 309, and also pulses a reset signal high to turn on the reset gate 307, which resets the floating diffusion region to $V_{dd}$. The reset signal then passes to low. At approximately the same time the reset signal goes high, timing and control circuitry 895 pulses a sample and hold reset (SHR) signal high to cause sample and hold (S/H) circuitry 896 to read out the voltage, $V_{pc2}$, which indicates the voltage on the floating diffusion region 330. ALC circuitry 883 monitors $V_{pc2}$. In the example of FIG. 9A, prior to charge integration at time t=0, $V_{pc2}=V_{dd}$. FIG. 10A is a potential well diagram for the pixel cell 300 at t=0. A potential well of pinned photodiode 320 is depicted as empty since no charge has been generated. When the reset gate is in an on state, there is no potential well corresponding to the floating diffusion region 330, as depicted in FIG. 10A.

Figure 10B:
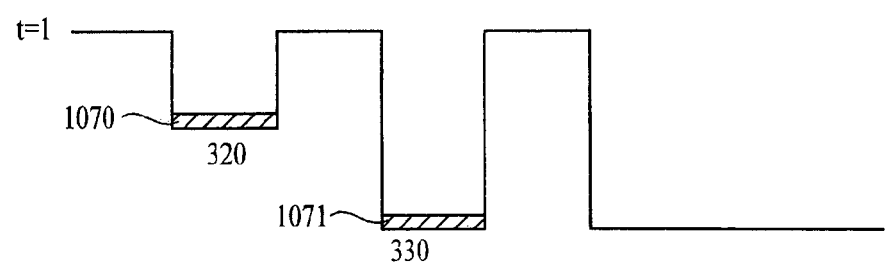
FIG. 10B is a potential well diagram of a pixel cell corresponding to a monitoring operation of FIG. 9B.

As shown in FIG. 10B, at a time t=1, the reset gate is in an off state, pinned photodiode 320 has generated an amount of charge 1070, and floating diffusion region 330 has generated an amount of charge 1071. The amounts of charge 1070, 1071 generated by pinned photodiode 320 and floating diffusion region 330, respectively, depend on the amount of external light incident on pixel cell 300. The charge 1071 on floating diffusion region 330 is monitored as illustrated in FIG. 9B in response to signals from timing and control circuit 895. When an RS signal and SHR signal are high, $V_{pc2}$ is sampled, and has a magnitude that depends on charge 1071.

Where peak value monitoring circuitry 885 is used and no monitored pixel cell has a $V_{pc2}$ which has approximately reached a value of $V_{trigger}$, monitoring continues and the charge 1070 on pinned photodiode 320 is not read out. Where average value monitoring circuitry 884 is used and $V_{avg}$ has not approximately reached the value of $V_{trigger}$, monitoring continues and the charge 1070 on pinned photodiode 320 is not read out. In the example of FIGS. 9B and 10B, average value monitoring circuitry 884 is used and $V_{avg}$ has not approximately reached the value of $V_{trigger}$, so the monitoring process continues.

Figure 10C:
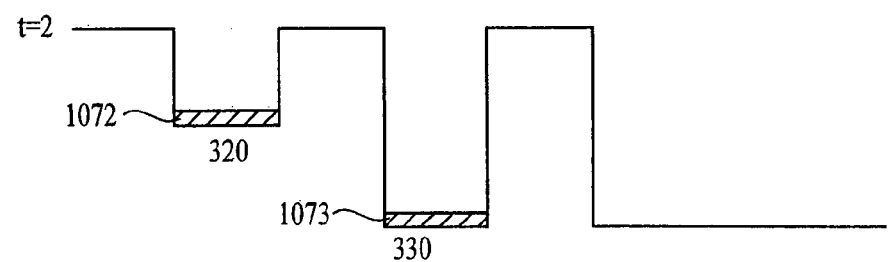
FIG. 10C is a potential well diagram of a pixel cell corresponding to a monitoring operation of FIG. 9C.

As shown in FIG. 10C, at time t=2 pinned photodiode 320 has generated an amount of charge 1072 and floating diffusion region 330 has generated an amount of charge 1073, which are greater than the amounts of charge 1070 and 1071 generated at time t=1, respectively. FIG. 9C illustrates the continued monitoring process at time t=2, which is similar to that at time t=1, except that because the amount of charge 1073 on the floating diffusion region 330 is greater, $V_{pc2}$ is changed. In the example of FIGS. 9C and 10C, $V_{avg}$ is approximately equal to $V_{trigger}$. Therefore, monitoring circuitry 884 provides a signal to timing and control circuitry 895, indicating that the criterion has been met for readout of the charge 1072 on pinned photodiode 320. In response, timing and control circuitry 895 provides signals for readout of all pixel cells of array 777.

Figure 11:
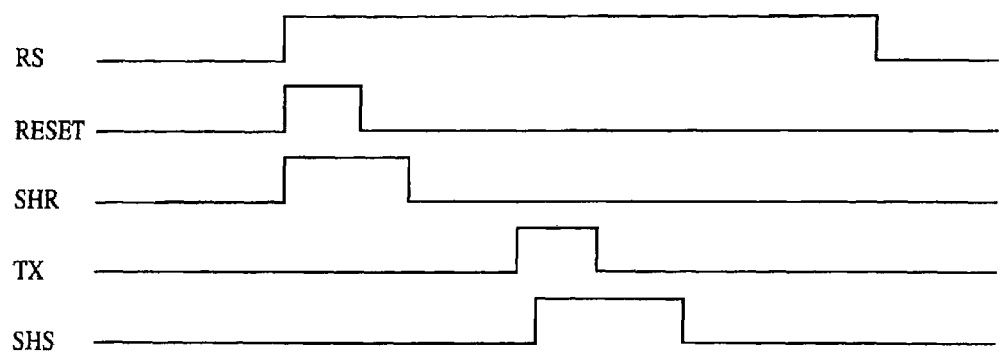
FIG. 11 is an exemplary timing diagram for a readout operation of an image sensor.
Figure 12A:
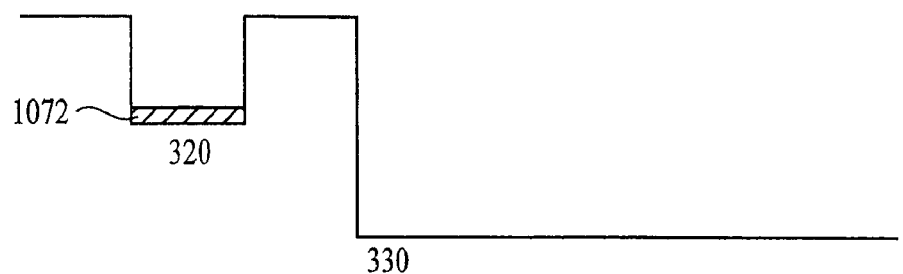
FIG. 12A is a potential well diagram of a pixel cell during an initial stage of readout.
Figure 12B:
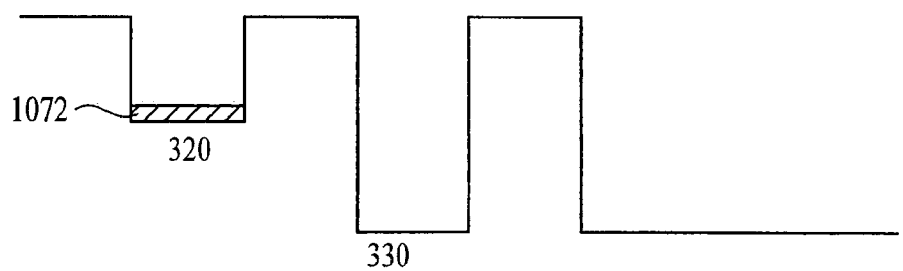
FIG. 12B is a potential well diagram of a pixel cell during an intermediate stage of readout.
Figure 12C:
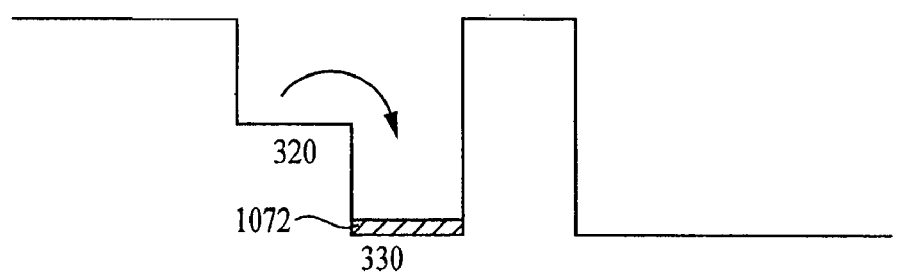
FIG. 12C is a potential well diagram of a pixel cell during an intermediate stage of readout.

All pixel cells of array 777 are read out row-by-row in a similar manner. For simplicity, readout of a single pixel cell is described below, and readout of all pixel cells in array 777 occurs similarly. FIG. 11 depicts an exemplary timing diagram for readout of the pixel cell 300. FIGS. 12A-12C show potential well diagrams illustrating readout of the charge 1072 on pinned photodiode 320. As shown in FIG. 11 a RS signal turns on the gate 309 of the row select transistor. When the RS signal is high, a reset signal is pulsed high causing the gate 307 of the reset transistor to turn on to reset the floating diffusion region 330 to $V_{dd}$. When the reset gate is in an on state, there is no potential well corresponding to the floating diffusion region 330, as shown in FIG. 12A. The reset voltage on the floating diffusion region 330 is applied to the gate of the source follower transistor, providing current that passes through the row select transistor to readout circuitry. The readout circuitry connects the current to a voltage level $V_{pc2}$ at the input to S/H 896. An SHR signal is also pulsed high to cause S/H 896 to store $V_{pc2}$. When readout of $V_{pc2}$ is completed, the reset and SHR signals transition to low.

FIG. 12B shows the potential well of floating diffusion 330 after it has been reset, with the reset gate in an off state, and before readout of the photo-generated charge 1072 on the photodiode 320. There is photo-generated charge 1072 on photodiode 320, but floating diffusion region 330 is empty of photo-generated charge.

After readout of $V_{pc2}$ and when the RS signal is high, a TX signal is pulsed high to cause the transfer gate 306 to turn on the transfer transistor, allowing the photo-generated charge 1072 to flow from the photodiode 320 to the floating diffusion region 330. FIG. 12C shows the potential well diagram as photo-generated charge is transferred from pinned photodiode 320 to floating diffusion region 330. When transfer gate 306 is in an on state, a potential barrier between pinned photodiode 320 and floating diffusion region 330 is lowered and photo-generated charge 1072 moves to floating diffusion region 330. Once the charge is transferred to floating diffusion region 330, the TX signal passes to low.

With the RS signal high, the photo-generated charge 1072 on floating diffusion region 330 is applied to the gate 308 of the source follower transistor to control the current passing through row select transistor to readout circuitry. The readout circuitry connects the current to a voltage level $V_{pc1}$ at the input to S/H 896. A sample and hold signal (SHS) signal is also pulsed high to cause S/H 896 to store $V_{pc1}$, indicating the quantity of photo-generated charge 1072 from the photodiode 320. When readout of $V_{pc1}$ is completed, the RS and SHS signals transition to low.

Referring to FIG. 8, for readout CDS is performed and a differential signal ($V_{pc2}$-$V_{pc1}$) is produced by differential amplifier (AMP) 887 for each pixel. It should be noted that for the CDS operation, $V_{pc2}$ is representative of the reset voltage, $V_{dd}$, on the floating diffusion region 330, and not photo-generated charge. The differential signal is amplified and digitized by analog to digital converter (ADC) 898.

The analog to digital converter 898 supplies the digitized pixel signals to an image processor 889 which forms a digital image.

Figure 13:
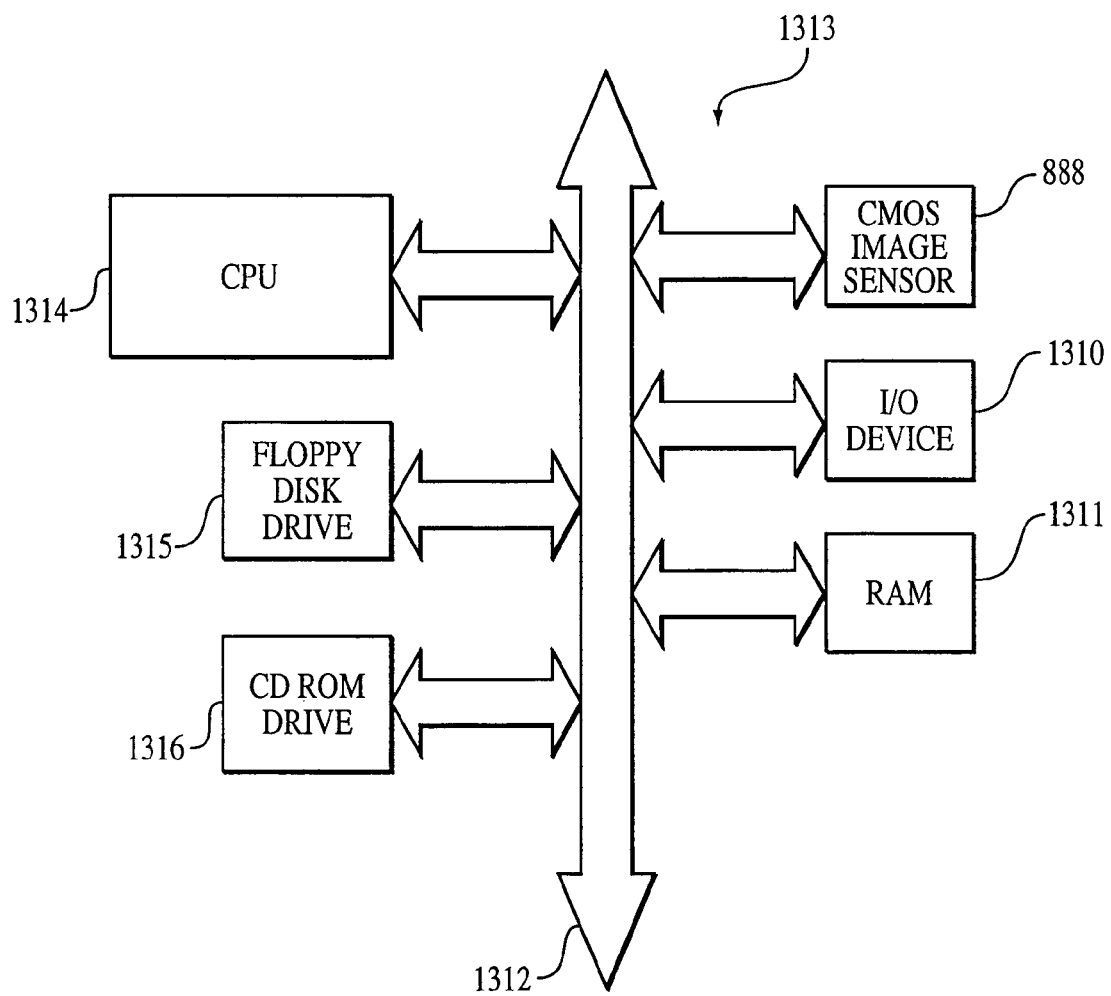
FIG. 13 is a block diagram of a processing system according to an embodiment of the invention.

A processor-based system 1313 according to an embodiment of the invention, including the CMOS image sensor 888 of FIG. 8, is illustrated generally in FIG. 13. A processor-based system 1313 is exemplary of a system having digital circuits that could include CMOS imager devices. Without being limiting, such a system could include a computer system, camera system, scanner, machine vision, vehicle navigation, video phone, surveillance system, auto focus system, star tracker system, motion detection system, image stabilization system, and data compression system. Notably, the processor-based system 1313 may be particularly useful in camera systems for medical devices, such as endoscopes or pill cameras.

A processor-based system, for example a computer system, generally comprises a central processing unit (CPU) 1314, such as a microprocessor, that communicates with an input/output (I/O) device 1310 over a bus 1312. The CMOS imager 888, which produces an image output from a pixel array, also communicates with the CPU 1314 over bus 1312. The processor-based system 1313 also includes random access memory (RAM) 1311, and may include peripheral devices, such as a floppy disk drive 1315 and a compact disk (CD) ROM drive 1316, which also communicate with CPU 1314 over the bus 1352. The CMOS imager 888 may be combined with a processor, such as a CPU, digital signal processor, or microprocessor, with or without memory storage on a single integrated circuit or on a different chip than the processor.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention.

What is claimed as new and desired to be protected by Letters Patent of the United States is:

1. A pixel cell comprising:
   a first pinned photodiode that generates charge;
   a second pinned photodiode that generates charge, wherein the second pinned photodiode has a higher pinning voltage than the first pinned photodiode; and
   a first transistor coupled between the first and second pinned photodiodes.

2. The pixel cell of claim 1, wherein the second pinned photodiode is a floating diffusion region that generates charge in response to impinging light from an image.

3. The pixel cell of claim 1, further comprising a second transistor coupled to the first pinned photodiode.

4. The pixel cell of claim 1, further comprising a gate of a second transistor electrically connected to the second pinned photodiode, wherein the second transistor is an output source follower transistor.

5. The pixel cell of claim 3, wherein a gate of the second transistor is proximate to a doped well.

6. The pixel cell of claim 1, wherein the second pinned photodiode is within a doped well.

7. The pixel cell of claim 6, wherein the first pinned photodiode is outside of the doped well.

8. The pixel cell of claim 1, further comprising a doped well between the first and second photodiodes.

* * * * *